(12) United States Patent
Lu et al.

(10) Patent No.: US 9,230,839 B2
(45) Date of Patent: Jan. 5, 2016

(54) RETICLE POD HAVING GAS GUIDING APPARATUS

(71) Applicant: GUDENG PRECISION INDUSTRIAL CO., LTD., New Taipei (TW)

(72) Inventors: Pao-Yi Lu, New Taipei (TW); Tien-Jui Lin, New Taipei (TW)

(73) Assignee: Gudeng Precision Industrial Co., Ltd., New Taipei (TW)

( * ) Notice: Subject to any disclaimer, the term of this patent is extended or adjusted under 35 U.S.C. 154(b) by 276 days.

(21) Appl. No.: 13/889,498

(22) Filed: May 8, 2013

(65) Prior Publication Data
US 2014/0291198 A1 Oct. 2, 2014

(30) Foreign Application Priority Data
Mar. 26, 2013 (TW) .............................. 102110717 A

(51) Int. Cl.
*H01L 21/673* (2006.01)
(52) U.S. Cl.
CPC .... *H01L 21/67359* (2013.01); *H01L 21/67393* (2013.01)

(58) Field of Classification Search
USPC .......................... 206/710, 711, 712, 454, 455
See application file for complete search history.

(56) References Cited

U.S. PATENT DOCUMENTS

| | | | |
|---|---|---|---|
| 5,879,458 A * | 3/1999 | Roberson et al. ............. | 118/715 |
| 6,276,552 B1 * | 8/2001 | Vervisch ....................... | 220/324 |
| 2012/0297981 A1 * | 11/2012 | Burns et al. .................... | 95/273 |

* cited by examiner

*Primary Examiner* — Mickey Yu
*Assistant Examiner* — Allan Stevens
(74) *Attorney, Agent, or Firm* — Rosenberg, Klein & Lee

(57) ABSTRACT

The present invention relates to a reticle pod having gas guiding apparatus. The gas guiding apparatus communicates with at least an inlet of the reticle pod and comprises a first outlet corresponding to a first gas flowing space of the reticle pod and a second outlet corresponding to a second gas flowing space. When the inlet supplies a high-purity gas to the gas guiding apparatus, the high-purity gas will flows through the gas guiding apparatus, and flow to the first and second gas flowing spaces via the first and second outlets, respectively to distribute uniformly in the first and second gas flowing spaces. In addition, the cleaning efficiency on the reticle is improved; the contact between the reticle and air can be avoided for protecting the reticle. Thereby, the usage of the high-purity gas is reduced, and the filling efficiency of the high-purity gas is enhanced.

8 Claims, 13 Drawing Sheets

RETICLE POD HAVING GAS GUIDING APPARATUS

FIELD OF THE INVENTION

The present invention relates generally to a reticle pod, and particularly to a reticle pod having gas guiding apparatus.

BACKGROUND OF THE INVENTION

Semiconductor technologies are developing rapidly in recent years. Especially, the lithography technology plays an important role in pattern definition. The application of the lithography technology in semiconductor is to fabricate transparent reticles with specific shapes according to the designed circuit. By using the exposure principle, light passes through reticles and projected to silicon wafers. After exposure, specific patterns are formed. Any dust, particle, or organic matter adhered to reticles will deteriorate the quality of the projected images. Thereby, the reticles used for generating patterns need to be kept absolutely clean. Accordingly, in general wafer fabrication processes, the environment of clean room is provided for avoiding pollution of the particles in the air. Nonetheless, current clean rooms cannot achieve the absolutely dust-free condition.

Antipollution reticle pods are generally adopted in modern semiconductor fabrication processes during storage and transportation for maintaining cleanness of reticles. In semiconductor fabrication processes, reticle pods are used for storing reticles for facilitating transit between processing machines; they isolate reticles from air for avoiding changes due to pollution by impurities. Thereby, in an advanced semiconductor fab, the cleanness of reticles is usually required to comply with the Standard Mechanical Interface (SMIF), namely, under Class I. Accordingly, for complying with the cleanness required by the SMIF, reticle boxes are generally filled with high-purity gas.

Presently, there is at least an inlet at the bottom of a reticle box. High-purity gas can be filled into the reticle pod via the inlet and flows naturally therein. The majority of the high-purity gas flows in the space between the reticle and the bottom of the reticle box; the rest of the high-purity gas flows in the space between the reticle and the top of the reticle pod. Thereby, the distribution of the high-purity gas in the reticle pod is nonuniform and hence the cleaning effect of the high-purity gas for the reticle pod is inferior; the high-purity gas has to be filled continuously into the reticle pod until the reticle is completely cleaned. Consequently, the usage of the high-purity has is increased, and the efficiency of filling high-purity gas into reticle pods is inferior.

Accordingly, the present invention provides a reticle pod having gas guiding apparatus, which comprises a gas guiding apparatus guiding the high-purity gas entering the reticle pod via the inlet. Thereby, the high-purity gas can be distributed uniformly in the spaces between the reticle and the top of the reticle pod and between the reticle and the bottom of the reticle pod. The problem described above can be thus solved.

SUMMARY

An objective of the present invention is to provide a reticle pod having gas guiding apparatus. The gas guiding apparatus guides the high-purity gas entering the reticle pod via at least an inlet to distribute uniformly in the spaced above and below the reticle for improving the efficiency of the high-purity gas cleaning the reticle. Hence, the usage of the high-purity gas can be reduced and the filling efficiency of the high-purity gas can be enhanced.

The present invention provides a reticle pod having gas guiding apparatus, which comprises a base, a cover, and at least a gas guiding apparatus. The base has at least an inlet. The cover is disposed over the base and forming an accommodating space between the cover and the base. The accommodating space accommodates a reticle, which divides the accommodating space into a first gas flowing space and a second gas flowing space. The gas guiding apparatus is disposed on the base and comprising a first gas guiding channel, at least a second gas guiding channel, at least a third gas guiding channel, a first outlet, and a second outlet. The first gas guiding channel communicates with the inlet. The second gas guiding channel and the third gas guiding channel communicate with the first gas guiding channel. The first outlet communicates with the second gas guiding channel. The second outlet communicates with the third gas guiding channel. The first outlet corresponds to the first gas flowing space; the second outlet corresponds to the second gas flowing space. The area of the opening of the first outlet is smaller than that of the opening of the second outlet so that the flow rate of a high-purity gas in the first gas flowing space is identical to that of the high-purity gas in the second gas flowing space.

DETAILED DESCRIPTION

In order to make the structure and characteristics as well as the effectiveness of the present invention to be further understood and recognized, the detailed description of the present invention is provided as follows along with embodiments and accompanying figures.

The reticle pod according the prior art comprises at least an inlet at its base for filling a high-purity gas into the reticle pod through the inlet. The high-purity gas flows into the reticle pod from the base of the reticle pod. The majority of the high-purity gas flows naturally in the space between the base of the reticle pod and a reticle in the reticle pod; the rest of the high-purity gas flows to the space between the reticle and a cover of the reticle pod. Thereby, the distribution of the high-purity gas in the reticle pod is nonuniform, which makes the cleaning effect of the high-purity gas on the reticle inferior. The high-purity gas even cannot isolate the reticle from external air completely. Consequently, the high-purity gas has to be filled into the reticle pod continuously until the reticle pod is cleaned. Hence, the usage of the high-purity has is increased and the filling of the high-purity gas into the reticle pod is inefficient.

Accordingly, the present invention provides a reticle pod having gas guiding apparatus. By using the gas guiding apparatus, the high-purity gas can be distributed uniformly in the spaces between the reticle and the cover of the reticle pod and between the reticle and the base of the reticle pod for improving the cleaning efficiency of the high-purity gas on the reticle. Besides, the possibility of the contact between the reticle and external air is reduced. Thereby, the usage of the high-purity gas is lowered. Meanwhile, the filling efficiency of the high-purity gas is enhanced.

Figure 1:
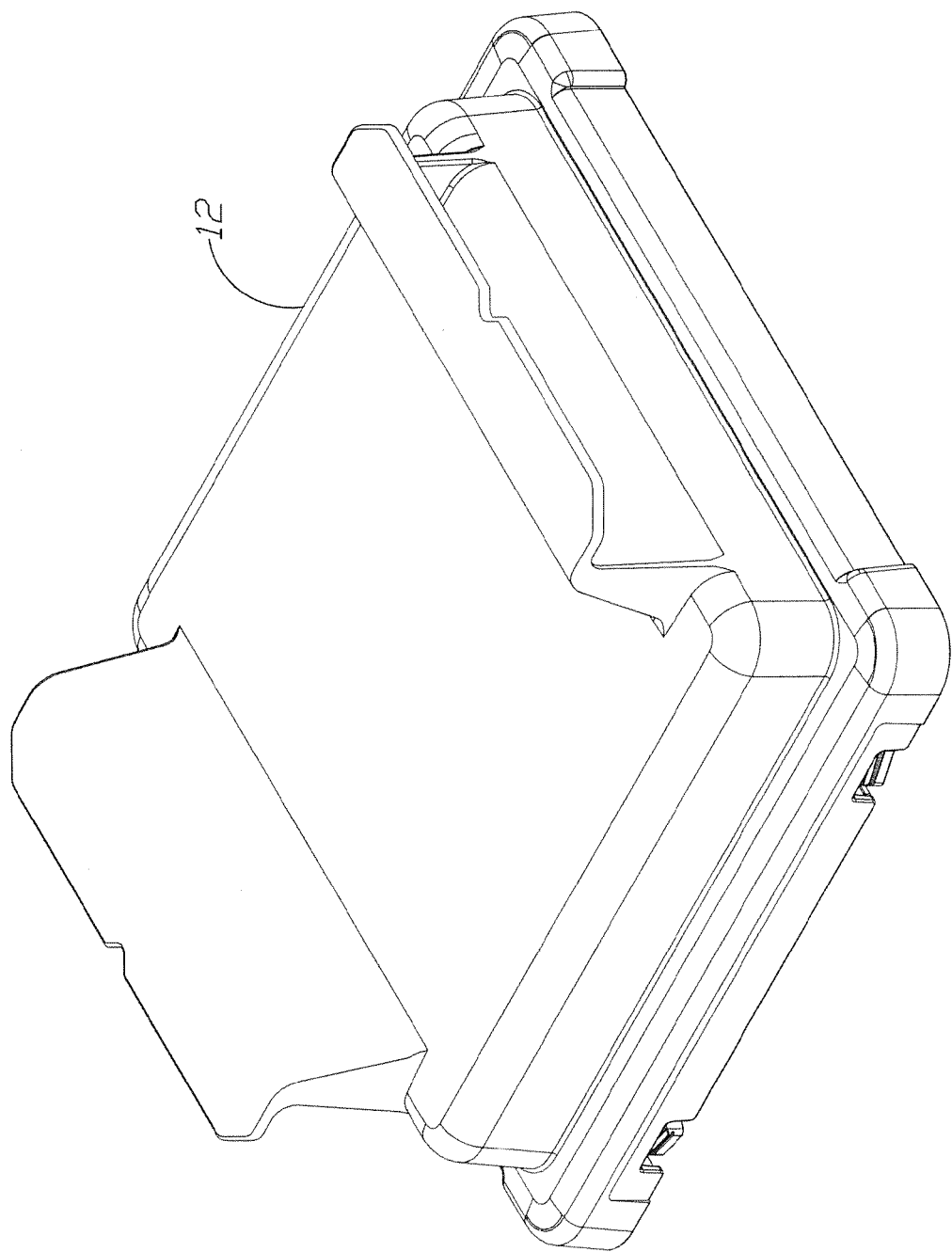
FIG. 1 shows an appearance diagram of the reticle pod according to the first embodiment of the present invention.
Figure 2:
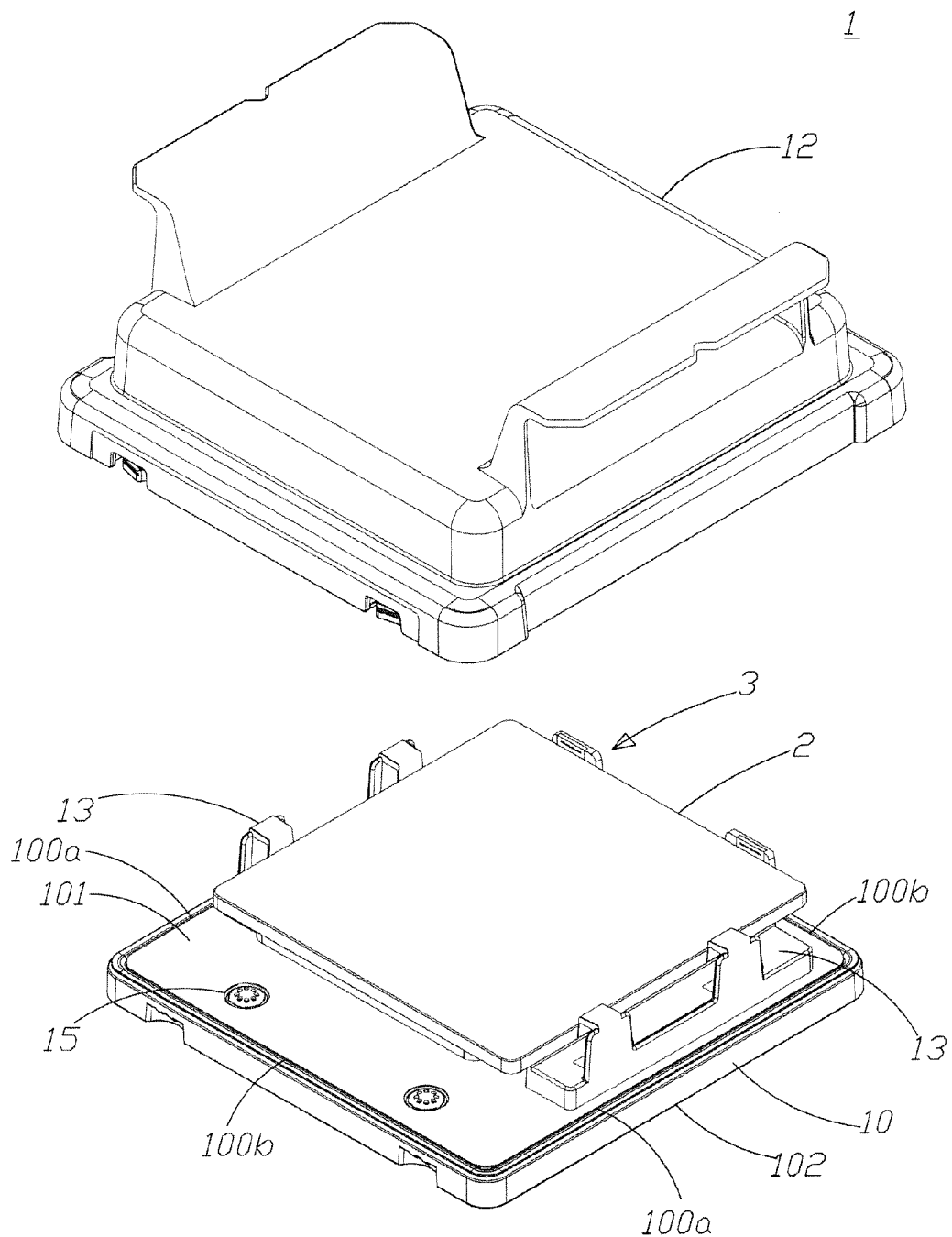
FIG. 2 shows an assembly diagram of the reticle pod according to the first embodiment of the present invention.
Figure 3:
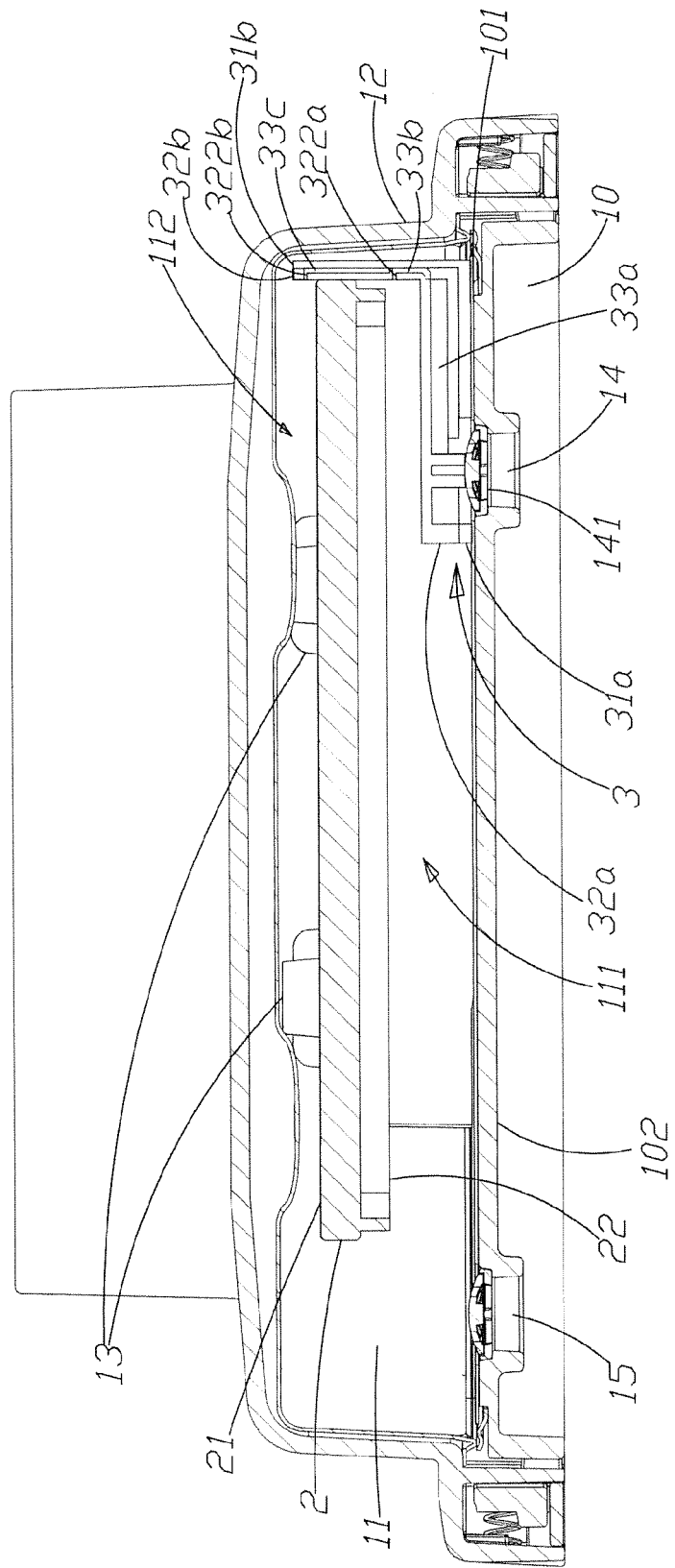
FIG. 3 shows a cross-sectional view of the reticle pod according to the first embodiment of the present invention.

FIGS. 1 to 3 show an appearance diagram, an assembly diagram, and a cross-sectional view of the reticle pod according to the first embodiment of the present invention. As shown in the figures, the present embodiment provides a reticle pod 1, which comprises a base 10 and a cover 12. The cover 12 is disposed over the base 10 and forming an accommodating space 11 between the cover 12 and the base 10. The accommodating space is used for accommodating a reticle 2. The base 10 has two opposing first sides 100a and two opposing second sides 100b. The base 10 has a first surface 101 facing the accommodating space 11; two positioning members 13 are disposed on the first surface 101 of the base 10. The two positioning members 13 are disposed oppositely and adjacent to the two first sides 100a of the base 10, respectively. The base 10 has two inlets 14. Each inlet 14 penetrates from a second surface 102, which faces the outside of the reticle 2, of the base 10 to the first surface 101 of the base 10. The two inlets 14 according to the present embodiment are adjacent to one of two second sides 100b, as the second side 100b on the right of the base 10 in FIG. 3. Each inlet 14 further has a valve 141. When the reticle 2 is disposed on the base 10 of the reticle pod 1, the reticle 2 is moved from one of the two second sides 100b to the other second side 100b. Taking FIG. 3 for example, the reticle 2 is moved from the left side of the base 10 to the right. Then the reticle 2 is disposed at the two positioning members 13, which are against the reticle 2 for avoiding movement of the reticle 2 between the two first sides 100a. Next, the cover 12 covers the base 10 to make the reticle 2 located inside the accommodating space 11. Then, a high-purity gas is filled via the two inlets 14. The valve 141 filters the high-purity gas and allows the high-purity gas to flow into the accommodating space 11. The high-purity gas cleans the reticle 2 located inside the accommodating space 11 and isolates the reticle 2 from external air.

When the reticle 2 is disposed in the accommodating space 11, the reticle 2 divides the accommodating space 11 into a first gas flowing space 111 and a second gas flowing space 112. The first gas flowing space 111 is the space between a bottom surface of the reticle 2 and the base 10; the second gas flowing space 112 is the space between a top surface 21 of the reticle 2 and the cover 12. In order to make the flow rate of the high-purity gas in the first and the second gas flowing spaces 111, 112 identical, the reticle pod 1 according to the present embodiment has two gas guiding apparatuses 3. Each gas guiding apparatus 3 is disposed on the base 10, located between the two positioning members 13, and adjacent to one of the two second sides 100b of the base 10. Each gas guiding apparatus 3 covers the corresponding inlet 14 for communicating with the inlet 14. Each gas guiding apparatus 3 guides the high-purity gas entering via the inlet 14 to flow to the first and second gas flowing spaces 111, 112 and makes the flow rates in the first and second gas flowing spaces 111, 112 identical.

Figure 4A:
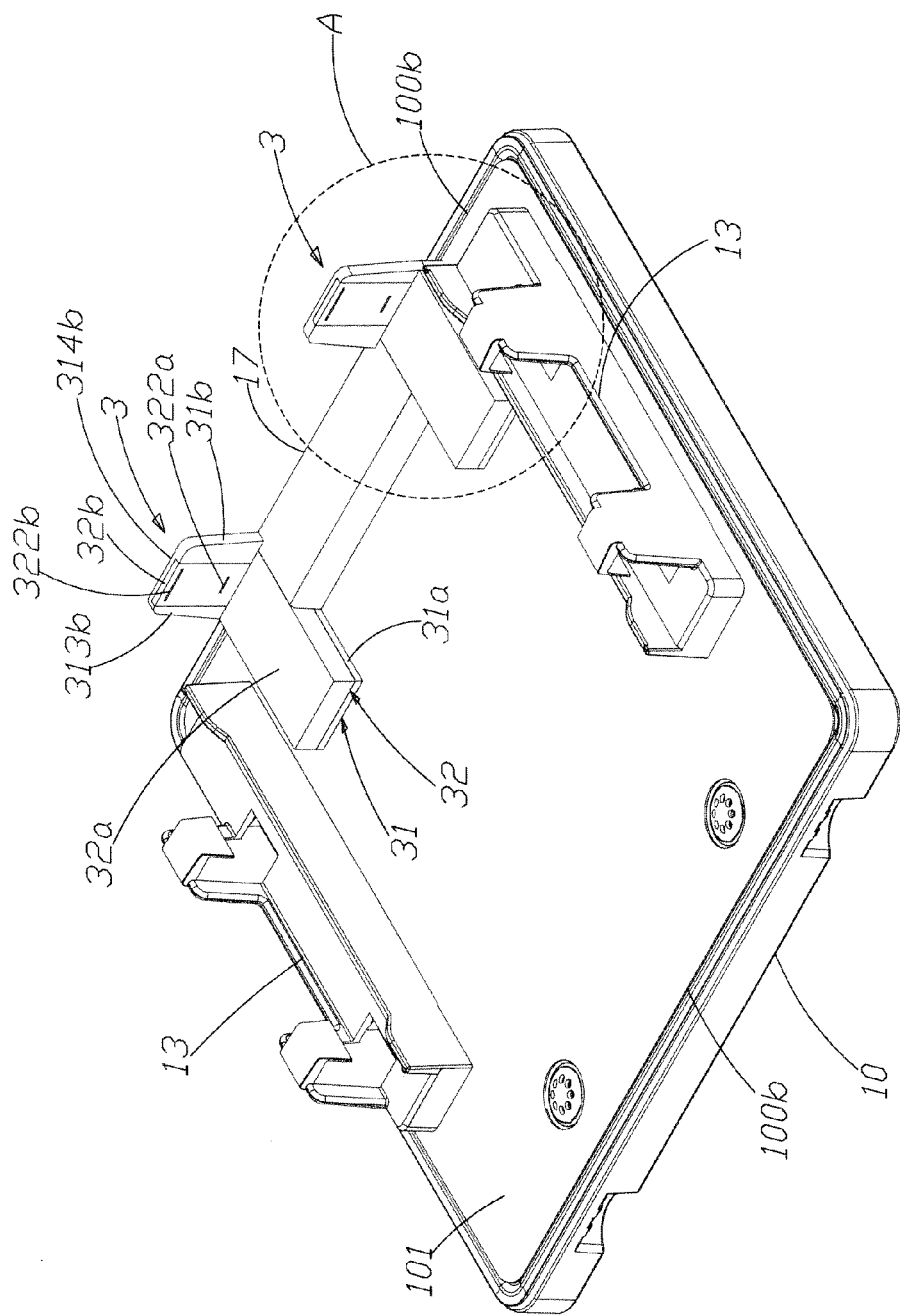
FIG. 4A shows an appearance diagram of the gas guiding apparatus according to the first embodiment of the present invention.
Figure 4B:
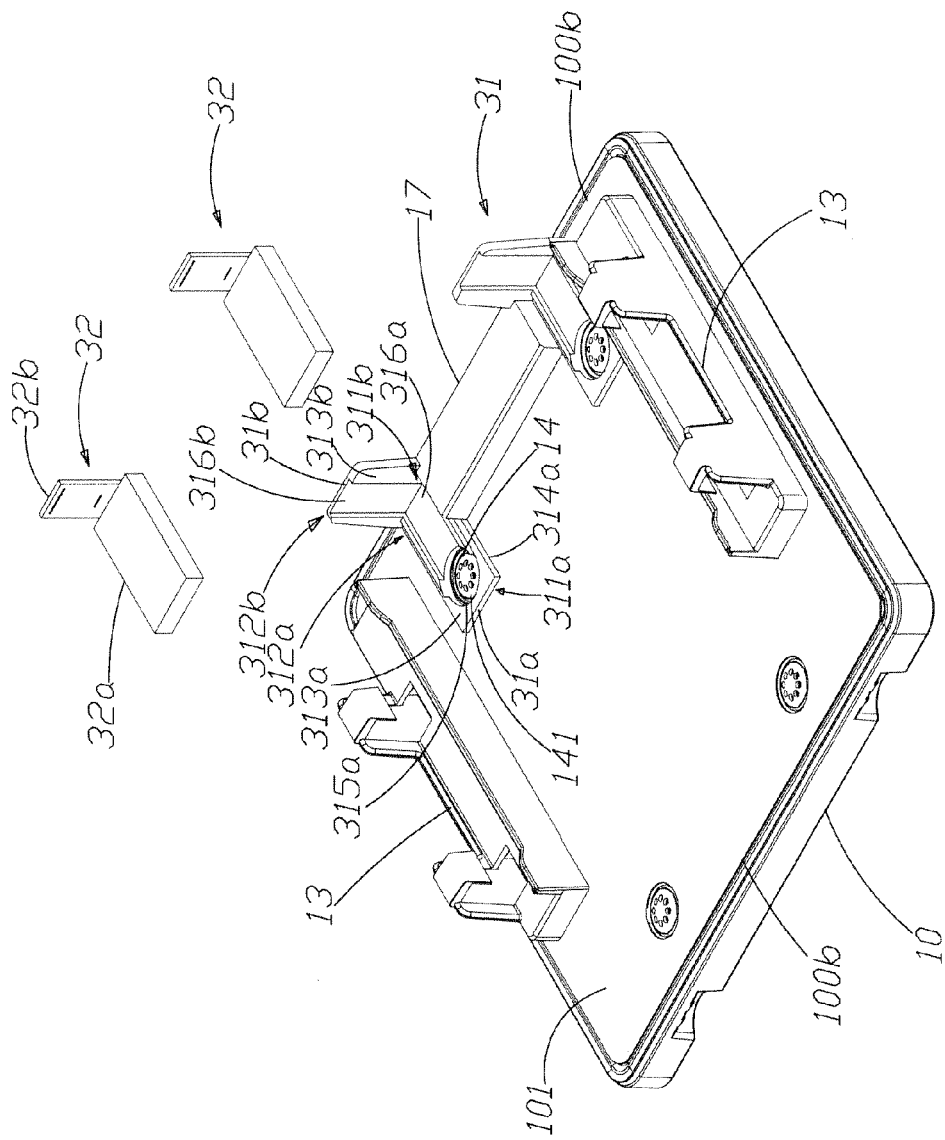
FIG. 4B shows an assembly diagram of the gas guiding apparatus according to the first embodiment of the present invention.
Figure 4C:
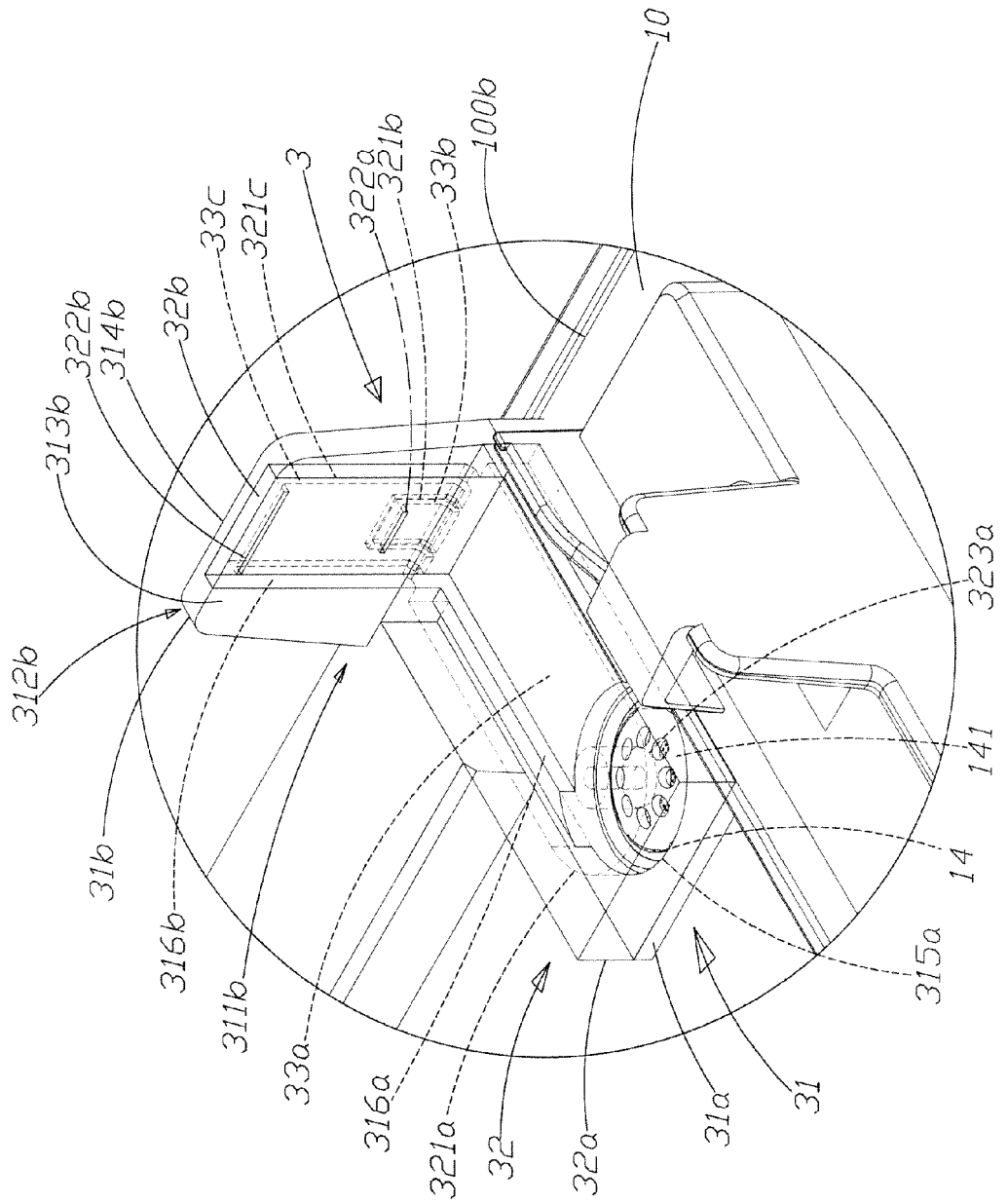
FIG. 4C shows a partially enlarged view of the region A in FIG. 4A according to the present invention.

In the following, the detailed structure of the gas guiding apparatus 3 according to the present embodiment will be described. FIG. 4A FIG. 4B show an appearance diagram and an assembly diagram of the gas guiding apparatus according to the first embodiment of the present invention; FIG. 4C shows a partially enlarged view of the region A in FIG. 4A according to the present invention. As shown in the figures, the gas guiding apparatus 3 according to the present embodiment comprises a guiding base 31 and a cap 32. The guiding base 31 is L-shaped and has a first body 31a and a second body 31b. When the guiding base 31 is disposed on the first surface 101 of the base 10, the first body 31a is disposed on the first surface 101 of the base 10 and has a first end 311a and a second end 312a. The first end 311a is located above the corresponding inlet 14; the second end 312a is adjacent to the second side 100b of the base 10. The second body 31b also has a first end 311b and a second end 312b. The first end 311b of the second body 31b is disposed at the second end 312a of the first body 31a; the second end 311b of the second body 31b extends in the direction away from the base 10. The second body 31b is perpendicular to the first body 31a for forming the L-shaped guiding base 31.

The first body 31a has a first surface 313a and a second surface 314a opposite to the first surface 313a. The first surface 313a is away from the first surface 101 of the base 10; the second surface 314a contacts the first surface 101 of the base 10. The first end 311a of the first body 31a has a hole 315a penetrating the first surface 313a and the second surface 314a of the first body 31a and corresponding to the inlet 14. Namely, the hole 315a communicates with the inlet 14. The first surface 313a of the first body 31a has a first accommodating trench 316a. One end of the first accommodating trench 316a communicates with the hole 315a; the other end of the first accommodating trench 316a extends to the second body 31b. The second body 31b also has a first surface 313b and a second surface 314b opposite to the first surface 313b. The first surface 313b faces the inside of the base 10 and has a second accommodating trench 316b. The second accommodating trench 316b extends from the first end 311b of the second body 31b to the second end 312b of the second body 31b. Besides, the second accommodating trench 316b communicates with the first accommodating trench 316a. The first and second bodies 31a, 31b according to the present embodiment can be formed integrally. The details will not be described here.

The cap 32 covers the guiding base 31. Thereby, the same as the guiding base 31, the cap 32 is L-shaped. The cap 32 has a first cap part 32a and a second cap part 32b. The first cap part 32a is disposed at the first body 31a. The first cap 32, which contacts the first surface 313a of the first body 31a, has a first groove 321a. The first groove 321a according to the present embodiment covers the hole 315a of the first body 31a and the first accommodating trench 316a completely. In other words, the shape of the first groove 321a complies with the shape formed by the hole 315a and the first accommodating trench 316a. In addition, a first gas guiding channel 33a is formed among the first groove 321a, the hole 315a, and the first accommodating trench 316a.

The second cap part 32b is completely accommodated in the second accommodating trench 316b. The second cap part 32b has at least a second groove 321b and at least a third groove 321c on the surface contacting the second body 31b. The second and third grooves 321b, 321c communicate with the first groove 321a. The second cap part 32b has a first outlet 322a and a second outlet 322b on the surface not contacting the second body 31b. The first outlet 322a corresponds to the first gas flowing space 111. The second outlet 322b is located above the first outlet 322a and corresponds to the second gas flowing space 112 (referring to FIG. 3). The first outlet 322a communicates with the second groove 321b; the second outlet 322b communicates with the third groove 321c. When the second cap part 32b is accommodated in the second accommodating trench 316b of the second body 31b, the second groove 321b and the third groove 321c form at least a second gas guiding channel 33b and at least a third gas guiding channel 33c with the second accommodating trench 316b, respectively. The second and third gas guiding channels 33b, 33c communicate with the first gas guiding channel 33a, respectively, and with the first outlet 322a and the second outlet 322b, respectively.

Figure 5:
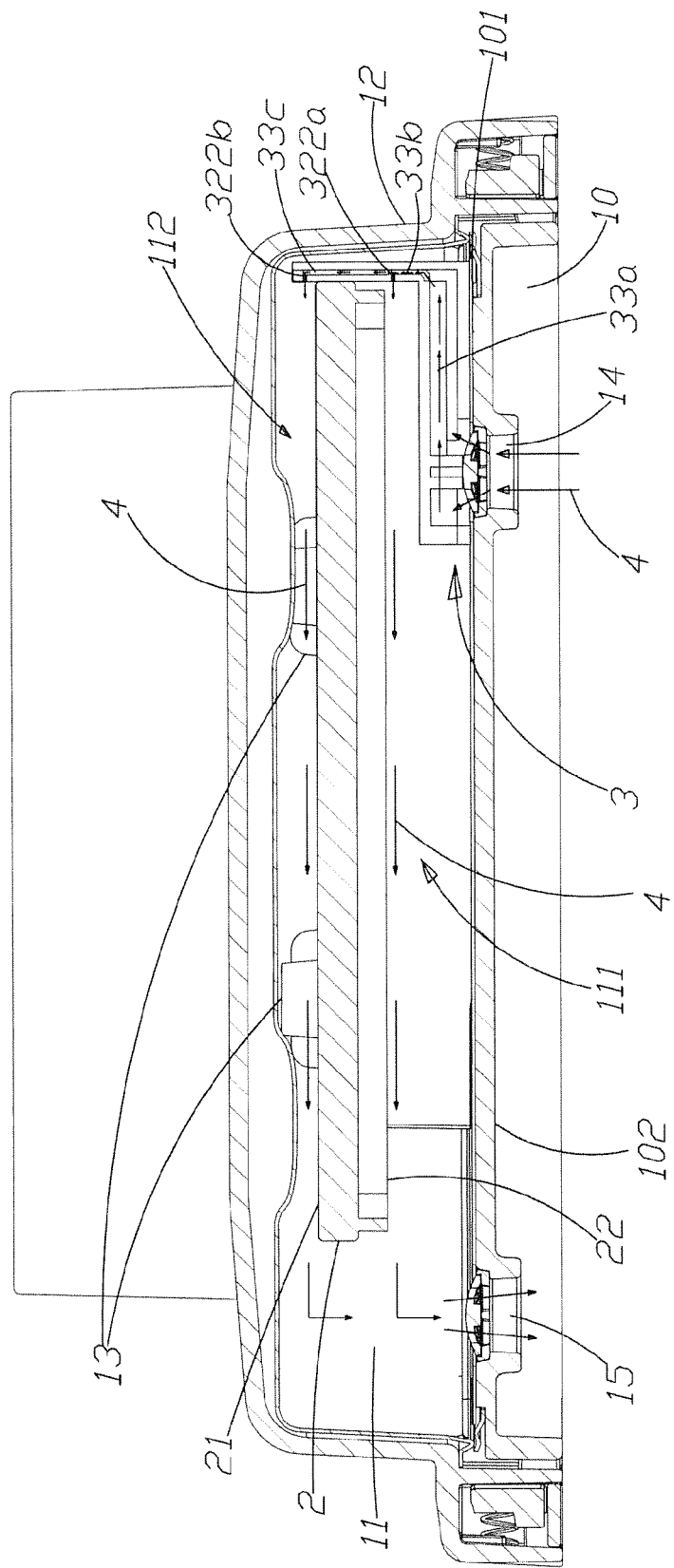
FIG. 5 shows a usage diagram of the reticle pod according to the first embodiment of the present invention.

FIG. 5 shows a usage diagram of the reticle pod according to the first embodiment of the present invention. As shown in the figure, when the high-purity gas 4 is filled via the two inlets 14 of the reticle pod 1, the high-purity gas 4 enters from the inlet 14 and flows to the first gas guiding channel 33a of the corresponding gas guiding apparatus 3. The high-purity gas 4 flows into the second and third gas guiding channels 33b, 33c, respectively, from the first gas guiding channel 33a. Finally, the high-purity gas 4 flowing into the second gas guiding channel 33b flows to the first gas flowing space 111 from the first outlet 322a. At the same time, the high-purity gas 4 flowing into the third gas guiding channel 33c flows to the second gas flowing space 112 from the second outlet 322b.

The area of the opening of the first outlet 322a according to the present embodiment is smaller that that of the opening of the second outlet 322b. If the flowing velocity is the same and the distances of the gas flowing to the first and the second outlets 322a, 322b are identical, the instantaneous flow rate of the high-purity gas flowing into the first gas flowing space 111 from the first outlet 322a is smaller than that into the second gas flowing space 112 from the second outlet 322b. Besides, the length of the second gas guiding channel 33b according to the present embodiment is smaller than that of the third gas guiding channel 33c. If the area of the opening of the first outlet 322a is equal to that of the opening of the second outlet 322b, given the same flowing velocity of gas and within the same time, the flowed quantity of the high-purity gas 4 into the first gas flowing space 111 from the first outlet 322a is greater than that into the second gas flowing space 112 from the second outlet 322b.

Accordingly, by matching the conditions of smaller opening area of the first outlet 322a than that of the second outlet 322b and shorter second gas guiding channel 33b than the third gas guiding channel 33c, the flow rate of the high-purity gas 4 into the first gas flowing space 111 from the first outlet 322a can be made to be identical to that into the second gas flowing space 112 from the second outlet 322b. Thereby, the high-purity gas 4 can clean the various parts of the reticle 2 uniformly and thus improving the cleaning efficiency of the high-purity gas 4 on the reticle 2. If the cleaning time for the reticle 2 is shortened, the time for supplying the high-purity gas 4 is reduced accordingly. Hence, the usage of the high-purity gas 4 is reduced. That is to say, by using the gas guiding apparatus 3, the high-purity gas 4 can be filled into the reticle pod 1 efficiently.

The first and second outlets 332a, 332b according to the present embodiment are long and narrow rectangular holes for increasing the air pressure of the high-purity gas 4 flowing from the first outlet 332a to the first gas flowing space 111 and from the second outlet 332b to the second gas flowing space 112. Hence, the high-purity gas 4 is jetted into the first and second gas flowing spaces 111, 112 and flows rapidly therein. In addition, because of the long and narrow rectangular holes, the high-purity gas 4 flowing from the first and second outlets 332a, 332b can be distributed in large area to the first and second gas flowing spaces 111, 112. Consequently, the efficiency of filling the high-purity gas 4 into the reticle pod 1 can be enhanced effectively.

Moreover, the base 10 of the reticle pod 1 further comprises at least an outlet 15 opposing to the two inlets 14 and adjacent to the other second side 100b. Taking FIG. 5 for example, the outlet 15 is located on the left side of the base 10. When the reticle 2 is disposed on the base 10, the two inlets 14 and the outlet 15 are located on both sides of the reticle 2. Thereby, the high-purity gas 4 entering from the two inlets 14 is guides by the two gas guiding apparatuses 3 to the first and second gas flowing spaces 111, 112. The high-purity gas 4 flows from one end of the first and second gas flowing spaces 111, 112 to the other end, respectively. Namely, when the high-purity gas 4 passes by the reticle 2, the high-purity gas 4 is mixed with the residual materials on the reticle 2. Then the high-purity gas containing the residual materials flows to the outlet 15 and is exhausted from the outlet 15 for maintaining high cleanness effectively in the reticle pod 1.

The first end 311a of the first body 31a is located above the corresponding inlet 14. The hole 315a of the first body 31a corresponds to the inlet 14; the diameter of the hole 315a should be greater than or equal to the diameter of the inlet 14. The high-purity gas 4 flowing from the inlet 14 can flow into the hole 315a completely. Besides, the high-purity gas 4 flows into the first gas guiding channel 33a completely. The high-purity gas 4 flows along the first gas guiding channel 33a and enters the second and third gas guiding channels 33b, 33c, and then flows into the first and second gas flowing spaces 111, 112 from the first outlet 322a of the second gas guiding channel 33b and the second outlet 322b of the third gas guiding channel 33c. Thereby, the loss of the high-purity gas 4 can be avoided and the usage of the high-purity gas 4 can be reduced. Consequently, the efficiency of filling the high-purity gas 4 into the reticle pod 1 is improved.

Furthermore, the sidewall of the first groove 321a disposed at the first cap part 32a of the first body 31a and corresponding to the inlet 14 is curved. As the high-purity gas 4 enters the gas guiding apparatus 3 from the inlet 14, the high-purity gas 4 is dispersed and flows freely in the first gas guiding channel 33a. In other words, a portion of the high-purity gas 4 flows along the second and third gas guiding channels 33b, 33c, while the rest contacts and flows along the curved sidewall, and thus redirecting the rest high-purity gas 4 to the second and third gas guiding channels 33b, 33c. Accordingly, the flow of the high-purity gas 4 is guided, ensuring that the high-purity gas 4 flowing from the inlet 14 is provided completely into the reticle pod 1; the usage of the high-purity gas 4 is reduced; and the efficiency of filling the high-purity gas 4 into the reticle pod 1 is enhanced.

The reticle pod 1 according to the present embodiment further comprises a connecting member 17 with both ends connecting to the first body 31a of each gas guiding apparatus 3, respectively and enabling the two first bodies 31a to form a single device by means of the connection of the connecting member 17. Thereby, the two first bodies 31a of the two gas guiding apparatuses 3 can be disposed on the first surface 101 of the base 10 simultaneously. In addition, the connecting member 17 can be formed integrally with the two first bodies 31a. Hence, the number of components can be reduced and the assembly procedure can be simplified. The gas guiding apparatus 3 according to the present embodiment further has the function of positioning the reticle 2 in the reticle pod 1 for preventing the reticle 2 from coming off the two positioning members 13. As the reticle 2 is disposed at the two positioning members 13 of the base 10, the first surface 311b of the second body 31b of each gas guiding apparatus 3 is against the side of the reticle 2, and thus avoiding displacement of the reticle 2 within the reticle pod 1 due to vibrations during the transit process. Hence, the limiting member used for propping up the side of the reticle 2 is replaced by the gas guiding apparatus 3 according to the present embodiment. Namely, the gas guiding apparatus 3 according to the present embodiment can be regarded as the limiting member having gas guiding function.

The cap 32 according to the present embodiment adopts a soft material. Hence, the thickness of the second cap part 32b is smaller than or equal to the height of the second accommodating trench 316b of the second body 31b. In other words, the surface of the second cap part 32b having the first and second outlets 322a, 322b is lower than the first surface 311b of the second body 31b. When the reticle 2 is disposed in the reticle pod 1, the side of the reticle 2 is against the first surface 311b of the second body 31b. The first surface 311b of the second body 31b supports the reticle 2. Thereby, the reticle 2 does not reduce the second and third gas guiding channels 33b, 33c between the second cap part 32b and the second body 31b, which allows the high-purity gas to flow smoothly in the second and third gas guiding channels 33b, 33c. Besides, the first cap part 32a according to the present embodiment also has a supporting pillar 323a, which is disposed in the first groove 321a and corresponding to the valve 141 in the inlet 14. When the first cap part 32a is installed on the first body 31a, the supporting pillar 323a is against the surface of the valve 141 and does not cover the inlet 14. Thus, the space of the first gas guiding channel 33a between the first cap part 32a and the first body 31a is maintained, making the high-purity gas flow smoothly in the first gas guiding channel 33a.

Figure 6A:
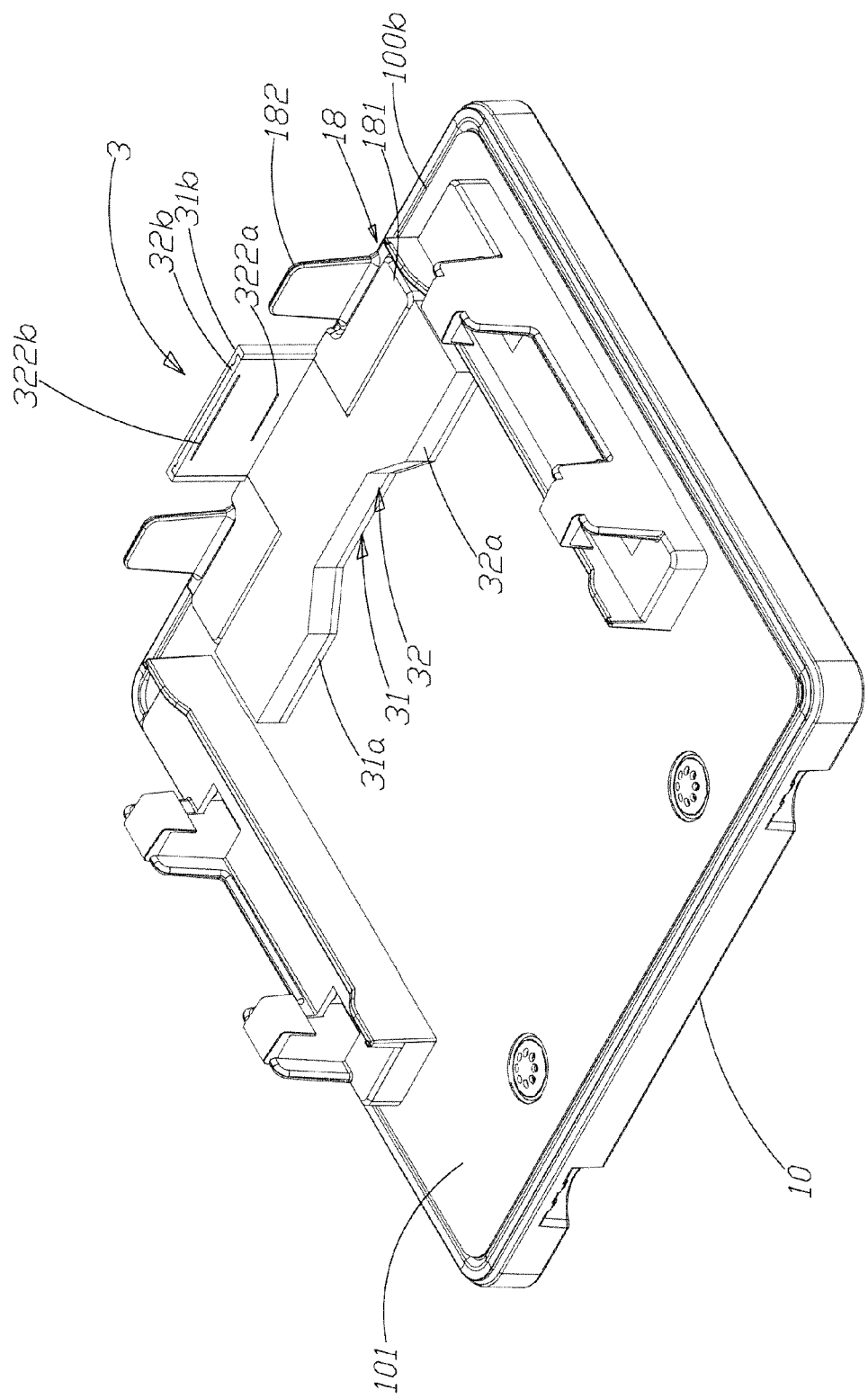
FIG. 6A shows an appearance diagram of the gas guiding apparatus according to the second embodiment of the present invention.
Figure 6B:
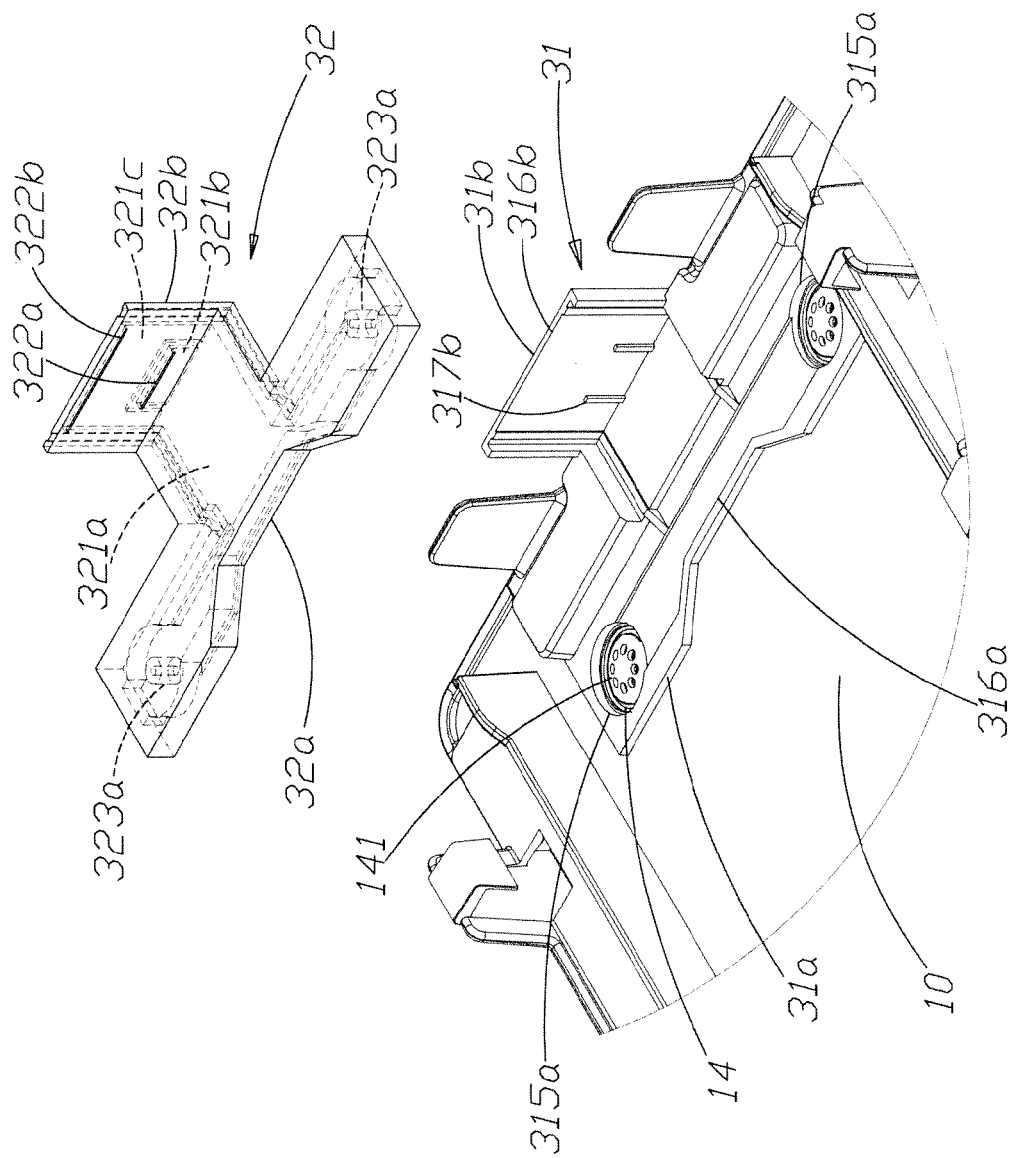
FIG. 6B shows an assembly diagram of the gas guiding apparatus according to the second embodiment of the present invention.

FIG. 6A and FIG. 6B show an appearance diagram and an assembly diagram of the gas guiding apparatus according to the second embodiment of the present invention. As shown in the figures, the difference between the present embodiment and the previous one is that the reticle pod 1 according to the previous embodiment has two gas guiding apparatuses 3 with each gas guiding apparatus 3 corresponding to an inlet 14. Nonetheless, the reticle pod 1 according to the present embodiment has only one gas guiding apparatus 3 corresponding to two inlets 14 simultaneously. Because the gas guiding apparatus 3 needs to correspond to two inlets 14 simultaneously, the structures of the guiding body 31 and the cap 32 are different from the ones according to the previous embodiment.

Figure 7:
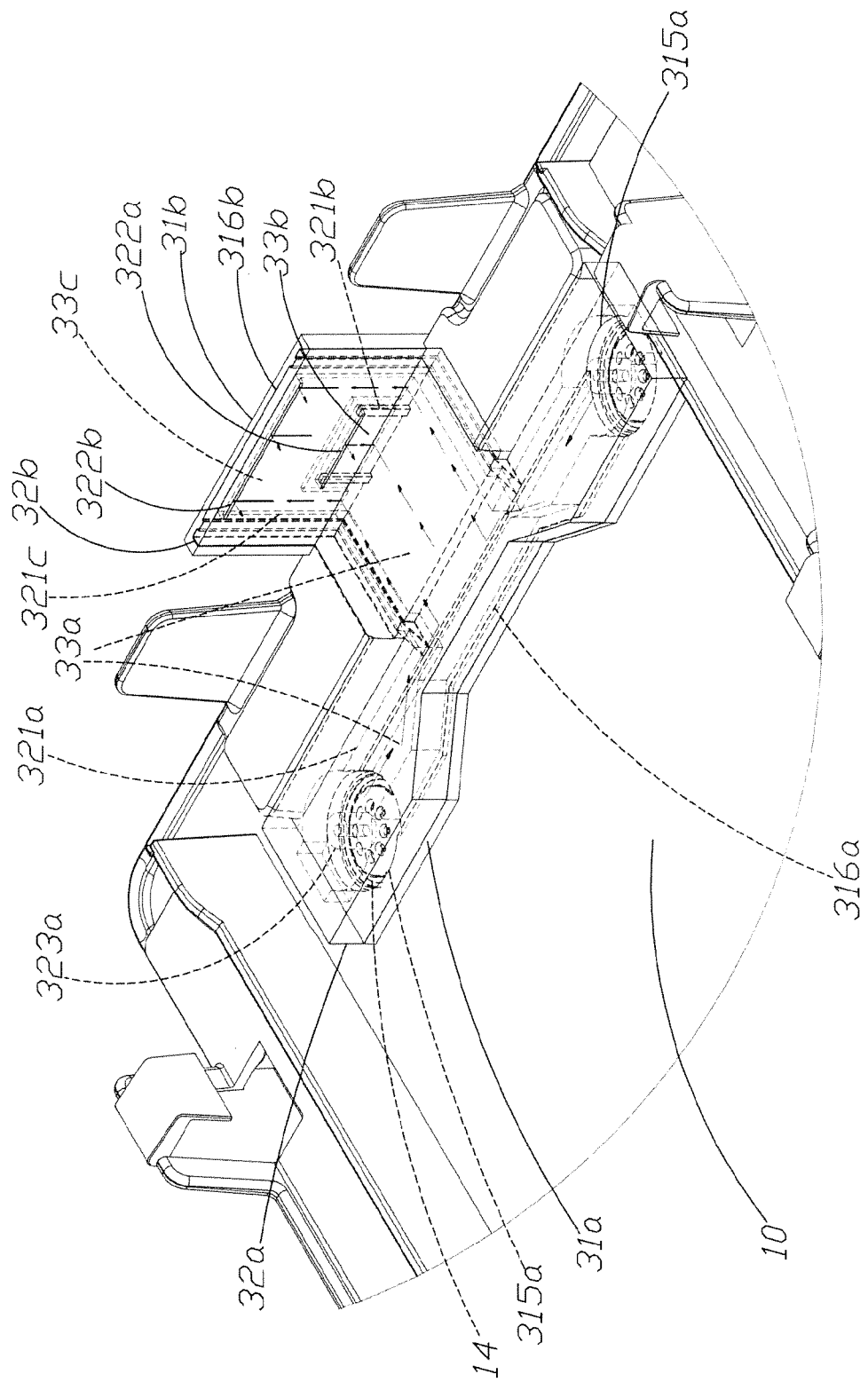
FIG. 7 shows a usage diagram of the reticle pod according to the second embodiment of the present invention.

The first body 31a of the guiding body 31 according to the present embodiment has two holes 315a corresponding to the two inlets 14, respectively. The first surface 313a of the first body 31a has the T-shapes first accommodating trench 316a, which communicates with the two holes 315a. Besides, the first cap part 32a of the cap 32 also has the first groove 321a corresponding to the first accommodating trench 316a and the two holes 315a. Please refer to FIG. 7. When the cap 32 is disposed on the guiding body 31, the first cap part 32a is disposed on the first body 31a. The first groove 321a corresponds to the two holes 315a and the first accommodating trench 316a, and forming the first gas guiding channel 33a with the two holes 315a and the first accommodating trench 316a. The first gas guiding channel 33a communicates with the second and third gas guiding channels 33b, 33c. The difference between the gas guiding apparatus 3 according to the present embodiment and the one according to the previous one is in the structures; their functions are totally the same. The details will not be described again.

The gas guiding apparatus 3 according to the present embodiment further comprises two limiting members 18 each including a base 181 and a limiting blockade 182. The limiting blockade 182 is disposed on the base 181. The two limiting members 18 are disposed on the first body 31a. Namely, the base 181 of each limiting member 18 is disposed on the first body 31a. The two limiting members 18 are located on both sides of the second body 31b of the guiding body 31, respectively. When the reticle 2 is disposed in the reticle pod 1, each limiting member 182 is against the side of the reticle 2 for avoiding displacement of the reticle 2 in the reticle pod 1. Moreover, the distances from the two limiting blockades 182 according to the present embodiment to the adjacent second side 100b are greater than the distance from the second cap part 32b to the adjacent second side 100b; the second cap part 32b is closer to the second side 100b than the two limiting blockades 192. Thereby, the reticle 2 will not be against the second cap part 32b directly; the second cap part 32b will not be compressed to the second body 31b and reducing the spaces in the second and third gas guiding channels 33b, 33c. Accordingly, the high-purity gas can flow smoothly in the second and third gas guiding channels 33b, 33c.

Because the areas of the second and third grooves 321b, 321c of the second cap part 32b are relatively large, namely, the hollow region of the second cap part 32b is greater, at least a supporting projective part 317b can be disposed in the second accommodating trench 316b of the second body 31b. The supporting projective part 317b corresponds to and supports the second groove 321b of the second cap part 32b for maintaining the space of the second gas guiding channel 32b formed between the second groove 321b and the second body 31b and thus making the high-purity gas to flow smoothly in the second gas guiding channel 33b. As the previous embodiment, the first cap part 31a according to the present embodiment has the supporting pillar 323a. The details will not be described again.

Figure 8A:
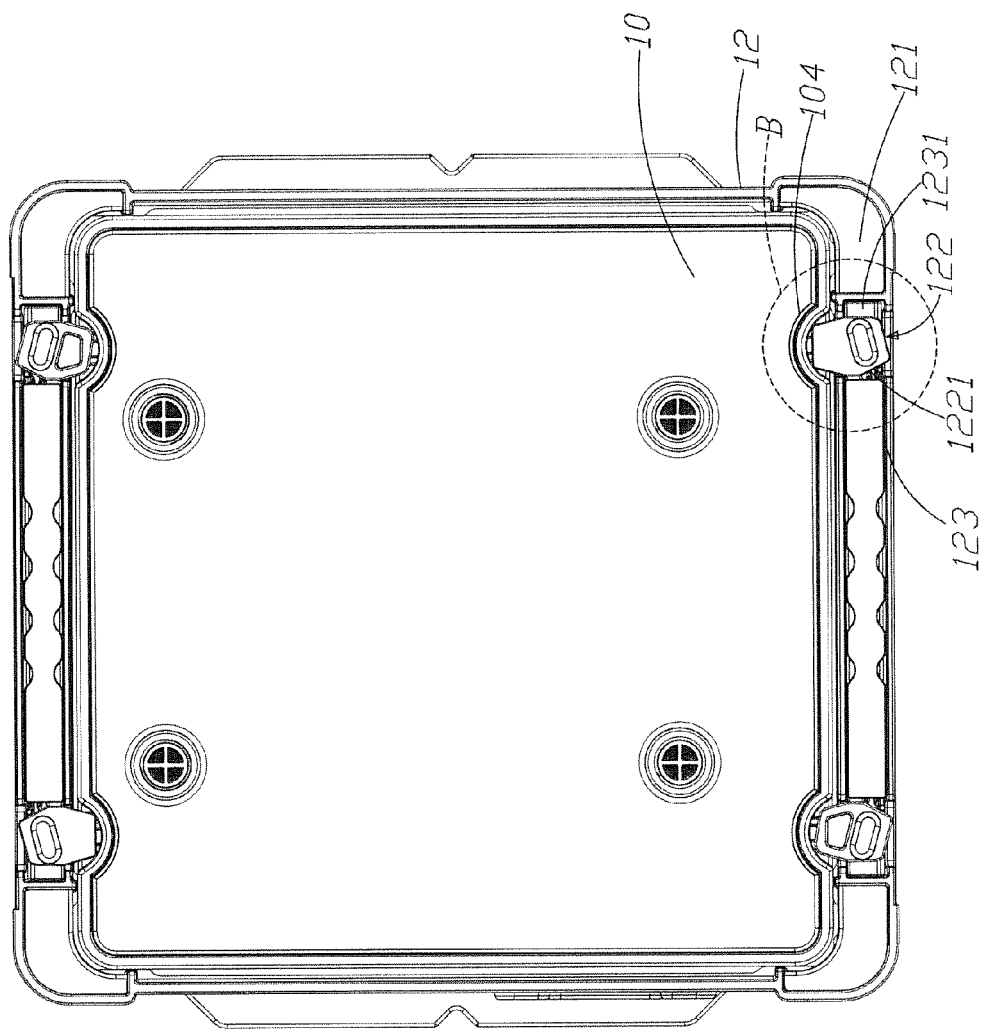
FIG. 8A shows a bottom view of the reticle pod according to the third embodiment of the present invention.
Figure 8B:
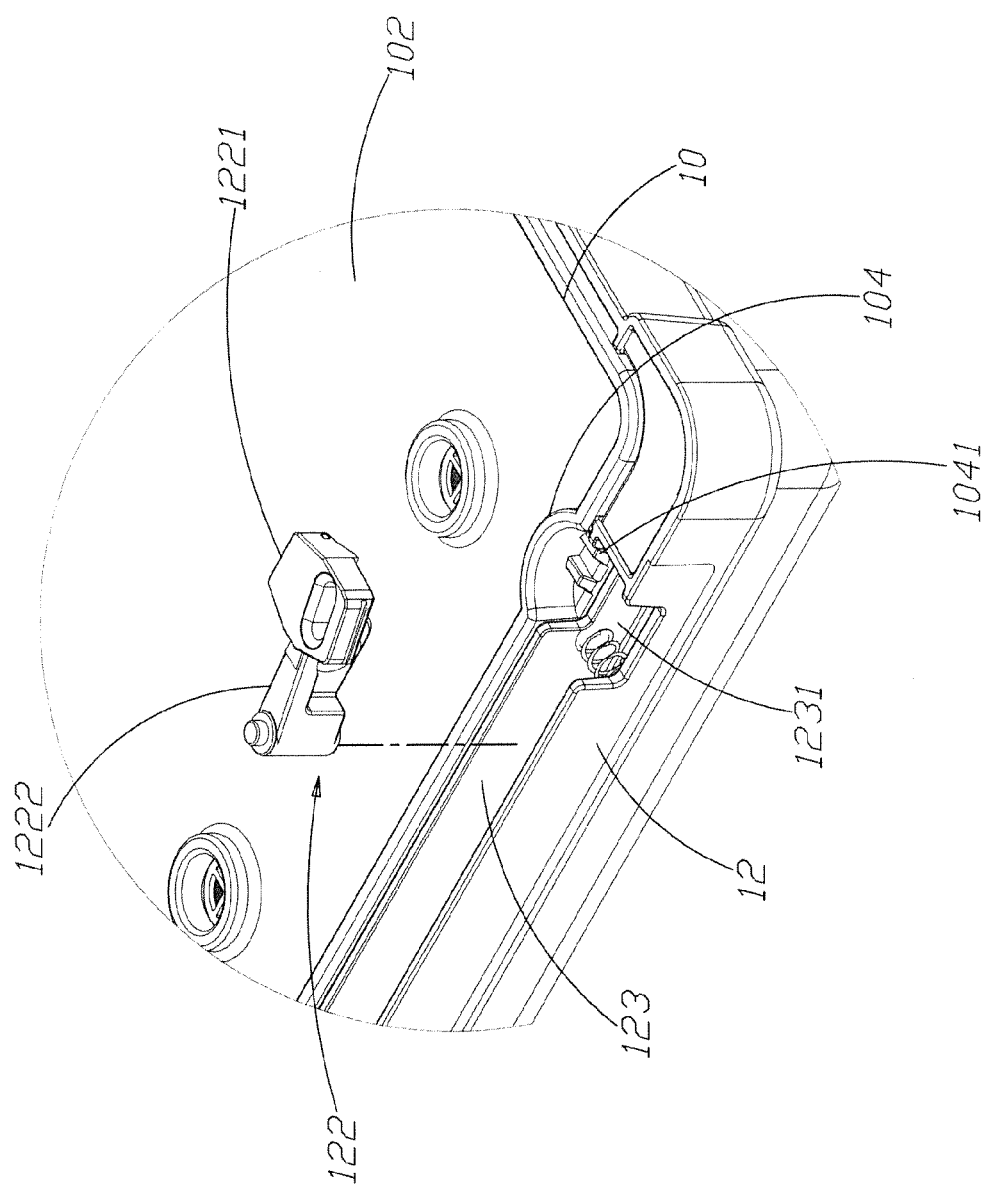
FIG. 8B shows a partially enlarged view of the region B in FIG. 8A according to the present invention.
Figure 8C:
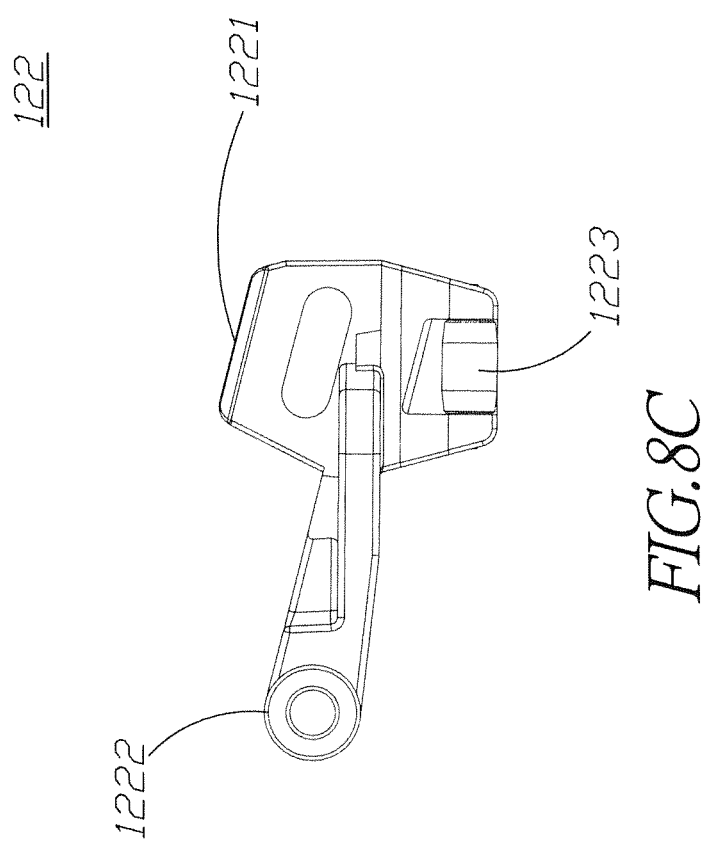
FIG. 8C shows a schematic diagram of the locking member according to the third embodiment of the present invention.

FIG. 8A shows a bottom view of the reticle pod according to the third embodiment of the present invention; FIG. 8B shows a partially enlarged view of the region B in FIG. 8A according to the present invention; and FIG. 8C shows a schematic diagram of the locking member according to the third embodiment of the present invention. As shown in the figure, the difference between the reticle pod 1 according to the present embodiment and the one according to the previous embodiment is that the cover 12 of the reticle pod 1 further comprises a plurality of locking members 122 on its bottom surface 121. A plurality of latch holes 104 are display on the second surface 102 of the base 10. The plurality of latch holes 104 correspond to the plurality of locking members 122. When the cover 12 is disposed on the base 10, the plurality of locking members 122 lock to the plurality of latch holes 104 of the base 10. Hence, the plurality of locking members 122 are held by the base 10 for fixing the cover 12 to the base 10.

Each locking member 122 has a locking part 1221 and a rotating arm 1222. One end of the rotating arm 1222 is connected to the locking part 1221. The rotating arm 1222 is connected pivotally in a corresponding installation groove 123 of the cover 12. The installation groove 123 has at least a notch 1231, which corresponds to the latch hole 104 of the base 10 and is provided for disposing the locking part 1221. When the cover 12 is disposed on the base 10, the locking part 1221 moves towards the outer side of the cover 12 first and drives the rotating arm 1222 to rotate. Then the cover 12 is disposed on the base 10 and the locking part 1221 is released. The rotating arm 1222 drives the locking part 1221 to move towards the corresponding latch hole 104 and make the locking part 1221 to locking in the latch hole 104. As the cover 12 comes off the base 10, the locking part 1221 is driven to move towards the outer side of the cover 12 first and then comes off the latch hole 104. Thereby, the base 10 comes off the cover 12. Afterwards, the locking part 1221 is released; the rotating arm 1222 drives the locking part 1221 to recover to its original position.

According to the present embodiment, there is further a roller 1223 on the surface each locking part 1221 contacting the latch hole 104. When the locking part 1221 locks to the corresponding latch hole 104, the roller 1223 rolls according to the movement of the locking part 1221. The roller 1223 contacts the sidewall of the latch hole 104 and rolls into the corresponding latch hole 104. Thanks to the roller 1223, the contact area between the locking part 1221 of each locking member 122 according to the present embodiment and the corresponding latch hole 104 is reduced, which reduces the friction between the locking part 1221 and the latch hole 104. Thereby, the locking part 1221 can enter or quit the latch hole 104 smoothly.

According to the present embodiment, there is further at least a guiding projective part 1041 on the surface of the latch hole 104 contacting the roller 1223. The surface of the guiding projective part 1041 contacting the roller 1223 is sloped for reducing the contact area, and thus the friction, between the roller 1223 and the latch hole 104 effectively. Thereby, the locking part 1221 can enter or quit the latch hole 104 more smoothly. In addition, the holding force of the plurality of locking parts 1221 of the plurality of locking member 122 on the base 10. Hence, the cover 12 can be fixed to the base 10 securely; the airtightness between the cover 12 and the base 10 is enhanced effectively.

To sum up, the present invention provides a reticle pod having gas guiding apparatus. At least a gas guiding apparatus is disposed in the reticle pod. By using the gas guiding apparatus, the high-purity gas entering via the inlet can be guided to distribute uniformly to the space above and below the reticle. Thus, the high-purity gas can clean the reticle evenly; the efficiency of the high-purity gas cleaning the reticle is improved effectively for maintaining the reticle pod in the high cleanness condition and avoiding the contact of the reticle with external air. Besides, the usage of the high-purity gas is reduced and thus enhancing the filling efficiency of the high-purity gas. Moreover, the gas guiding apparatus according to the present invention has the function of preventing displacement of the reticle in the reticle pod. The locking member of the reticle pod according to the present invention has the roller for reducing the friction between the locking member and the corresponding latch hole. Thereby, the locking member can enter and quit the latch hole smoothly.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. A reticle pod having gas guiding apparatus, comprising:
   a base, having at least one inlet;
   a cover, disposed on said base, having an accommodating space between said cover and said base, said accommodating space accommodating a reticle, said reticle dividing said accommodating space into a first gas flowing space and a second gas flowing space; and
   the gas guiding apparatus, disposed at said base, having a first gas guiding channel, at least a second gas guiding channel, at least a third gas guiding channel, a first outlet, and a second outlet, said first gas guiding channel communicating with said at least one inlet, said at least second gas guiding channel and said at least third gas guiding channel communicating with said first gas guiding channel, said first outlet communication with said at least second gas guiding channel, said second outlet communicating with said at least third gas guiding channel, said first outlet corresponding to said first gas flowing space, and said second outlet corresponding to said second gas flowing space;
   wherein an area of an opening of said first outlet is smaller than an area of an opening of said second outlet, so that a flow rate of a high-purity gas into said first gas flowing space is identical to a flow rate of said high-purity gas into said second gas flowing space; wherein said gas guiding apparatus comprises:
   a guiding body, disposed at said base, and located above said at least one inlet; and
   a cap, disposed at said guiding body, and forming said first gas guiding channel, said at least second gas guiding channel, and said third gas guiding channel with said guiding body, and said first outlet and said second outlet disposed at said cap;
   wherein said guiding body comprises:
   a first body, disposed at said base, located above said at least one inlet, having at least one hole and a first accommodating trench, said at least one hole corresponding to said at least one inlet, and said first accommodating trench communicating with said at least one hole; and
   a second body, disposed at said first body, having a second accommodating trench, and said second accommodating trench communicating with said first accommodating trench;
   wherein said cap comprises:
   a first cap part, disposed at said first body, having a first groove corresponding to said first accommodating trench and said at least one hole, and forming said first gas guiding channel; and
   a second cap part, accommodated in said second accommodating trench, having at least a second groove and at least a third groove, said at least second groove and said as least third groove corresponding to said second accommodating trench, and forming said at least second gas guiding channel and said at least third gas guiding channel, respectively;
   wherein said first cap part has at least a supporting pillar located in said first groove and against a surface of a valve of said at least one inlet.

2. The reticle pod having gas guiding apparatus of claim 1, wherein said second accommodating trench of said second body has at least one supporting projective part therein, and said at least one supporting projective part corresponds to said second groove of said second cap part and supports said second cap part.

3. The reticle pod having gas guiding apparatus of claim 1, wherein said first outlet and second outlet are rectangular holes, respectively.

4. The reticle pod having gas guiding apparatus of claim 1, and further comprising at least a limiting member, comprising a base and a limiting blockade, said base disposed at said first body, and said limiting blockade disposed at said base and against the side of said reticle.

5. The reticle pod having gas guiding apparatus of claim 4, wherein a distance between said limiting blockade and a side of the base of said reticle pod adjacent to said limiting blockade is greater than a distance between said second cap part and said side.

6. The reticle pod having gas guiding apparatus of claim 1, wherein a thickness of said second cap part is smaller or equal to a height of said second accommodating trench, and a first surface of said second body is against one side of said reticle.

7. The reticle pod having gas guiding apparatus of claim 1, and further comprising a plurality of locking members, connected pivotally in a plurality of installation grooves of said cover, respectively, and each said locking member comprising:
- a rotating arm, having one end connected pivotally to a corresponding one of the plurality of installation grooves; and
- a locking part, connected to other end of said rotating arm, said rotating arm rotating according to said locking part, said locking part locking to a latch hole of said base, and a roller is embedded on a surface of said locking part contacting said latch hole.

8. The reticle pod having gas guiding apparatus of claim 7, wherein at least a guiding projective part is disposed on a surface of said latch hole contacting said roller, and a surface of said guiding projective part contacting said roller is sloped.

* * * * *